US012660092B2

(12) United States Patent
Peng et al.

(10) Patent No.: US 12,660,092 B2
(45) Date of Patent: Jun. 16, 2026

(54) BASE BOARD FLOATING ARM

(71) Applicant: Sheng Chuan Technology Co., Ltd.,
Taoyuan City (TW)

(72) Inventors: Hsin-Jung Peng, Taoyuan City (TW);
Tsung-Che Yu, Taoyuan City (TW)

(73) Assignee: Sheng Chuan Technology Co., Ltd.,
Taoyuan City (TW)

( * ) Notice: Subject to any disclaimer, the term of this
patent is extended or adjusted under 35
U.S.C. 154(b) by 747 days.

(21) Appl. No.: 18/126,928

(22) Filed: Mar. 27, 2023

(65) Prior Publication Data

US 2024/0276647 A1 Aug. 15, 2024

(30) Foreign Application Priority Data

Feb. 13, 2023 (TW) ................................ 112104959

(51) Int. Cl.
*H05K 3/00* (2006.01)
*B25J 15/00* (2006.01)

(52) U.S. Cl.
CPC .......... *H05K 3/007* (2013.01); *B25J 15/0014*
(2013.01); *H05K 2203/0165* (2013.01)

(58) Field of Classification Search
CPC .... H10P 72/7602; H10P 72/608; H10P 72/78;
B25J 15/00; B25J 15/0014; H05K 3/007;
H05K 2203/0165
USPC ........................................... 414/941; 293/213
See application file for complete search history.

(56) References Cited

U.S. PATENT DOCUMENTS

| | | | | | |
|---|---|---|---|---|---|
| 5,022,695 A | * | 6/1991 | Ayers | .................. | H10P 72/7602 |
| | | | | | 414/416.03 |
| 5,700,046 A | * | 12/1997 | Van Doren | ............ | B25J 15/026 |
| | | | | | 294/902 |
| 6,322,116 B1 | * | 11/2001 | Stevens | ..................... | B25B 9/00 |
| | | | | | 414/941 |
| 6,898,487 B2 | * | 5/2005 | Bacchi | ................ | H10P 72/7602 |
| | | | | | 700/262 |
| 6,961,639 B2 | * | 11/2005 | Gaudon | ............ | G06K 7/10861 |
| | | | | | 700/218 |
| 7,401,828 B2 | * | 7/2008 | Yang | .................... | B65G 49/061 |
| | | | | | 414/941 |

(Continued)

FOREIGN PATENT DOCUMENTS

| | | |
|---|---|---|
| CN | 108364896 A | 8/2018 |
| TW | 200808637 A | 2/2008 |
| TW | 202203361 A | 1/2022 |

*Primary Examiner* — Bao-Thieu L Nguyen
(74) *Attorney, Agent, or Firm* — Bradley J. Thorson;
DeWitt LLP

(57) ABSTRACT

A base board floating arm includes a fixing base, at least one
carrier board, and at least one buckling set. The carrier board
has a connecting section, a buckling section, a carrier
section, and a carrier surface. The connecting section is
connected to the fixing base; the carrier section connects the
connecting section and the buckling section. An airflow
channel is formed within the carrier board. The carrier
surface includes a surface of the carrier board that faces
upward, and multiple airflow outlets are formed on the
carrier surface. The airflow outlets fluidly communicate with
the airflow channel. The buckling set has a buckling unit
movably mounted on the buckling section. The buckling unit
and the carrier board selectively fix the base board. Thereby
the base board floating arm is capable of preventing the base
board from vibrating or being wrinkled.

18 Claims, 15 Drawing Sheets

(56)　　　　　References Cited

U.S. PATENT DOCUMENTS

| | | | | |
|---|---|---|---|---|
| 7,644,968 B2 * | 1/2010 | Hirooka | H10P 72/7602 | 294/902 |
| 8,100,451 B2 * | 1/2012 | Okuda | B25J 15/0009 | 294/213 |
| 8,172,291 B2 * | 5/2012 | Hebiishi | H10P 72/7602 | 29/65 |
| 8,454,068 B2 * | 6/2013 | Hashimoto | B25J 15/00 | 294/902 |
| 8,899,650 B2 * | 12/2014 | Furuta | H10P 72/78 | 414/737 |
| 9,004,564 B2 * | 4/2015 | Pergande | B25J 15/0014 | 294/213 |
| 9,919,430 B1 * | 3/2018 | Bosboom | B25J 15/0014 | |
| 11,935,778 B2 * | 3/2024 | Kakinuma | H10P 72/78 | |
| 12,459,133 B2 * | 11/2025 | Yu | B25J 15/0033 | |
| 12,532,704 B2 * | 1/2026 | Hillman | H10P 72/0606 | |
| 2005/0006916 A1 * | 1/2005 | Mantz | H10P 72/7602 | 414/941 |

| | | | | |
|---|---|---|---|---|
| 2010/0290886 A1 * | 11/2010 | Hashimoto | B25J 15/0014 | 414/800 |
| 2014/0227072 A1 * | 8/2014 | Lee | H10P 72/78 | 294/213 |
| 2014/0265394 A1 * | 9/2014 | Pergande | B25J 15/0014 | 294/81.5 |
| 2015/0332950 A1 * | 11/2015 | Mazzocco | H10P 72/50 | 901/30 |
| 2017/0173799 A1 * | 6/2017 | LoPiccolo | B25J 15/0014 | |
| 2017/0323821 A1 * | 11/2017 | Thanu | H10P 72/7602 | |
| 2018/0104827 A1 * | 4/2018 | Goto | B25J 15/0014 | |
| 2021/0050244 A1 * | 2/2021 | Kakinuma | H10P 72/53 | |
| 2021/0354311 A1 * | 11/2021 | Fukushima | B25J 15/0028 | |
| 2022/0216090 A1 * | 7/2022 | Taboch | B25J 15/0616 | |
| 2022/0402145 A1 * | 12/2022 | Yu | B25J 15/0033 | |
| 2023/0317503 A1 * | 10/2023 | Shimizu | H10P 72/0606 | 414/751.1 |
| 2023/0373105 A1 * | 11/2023 | Lai | B25J 15/0616 | |
| 2024/0025054 A1 * | 1/2024 | Shimizu | B25J 11/0095 | |
| 2025/0381679 A1 * | 12/2025 | Matsumoto | B25J 15/0014 | |

* cited by examiner

BASE BOARD FLOATING ARM

BACKGROUND OF THE INVENTION

Field of the Invention

The present invention relates to a delivery device, especially to a base board floating arm that is capable of producing low-pressure with airflows to float and fix a base board.

Description of the Prior Arts

In a manufacturing process of base boards, a floating arm is configured to carry a base board in a contactless manner via injecting airflows beneath the base board to support the base board, the airflows also generate low pressure between the base board and the floating arm, and thereby the base board is fixed on the floating arm. Therefore, a goal of carrying the base board without contact is achieved to avoid damages to the base board caused by contacting, thereby increasing the production yield.

However, a base board composed of soft materials such as a thin metal board or a piece of metal foil is vulnerable to airflows around. Therefore, the base board vibrates and gets wrinkled during the delivery, which reduces the production yield.

To overcome the shortcomings, the present invention provides a base board floating arm to mitigate or obviate the aforementioned problems.

SUMMARY OF THE INVENTION

The main objective of the present invention is to provide a base board floating arm that is capable of preventing a carried base board from vibrating or getting wrinkled due to the surrounding airflows.

The base board floating arm has a fixing base, at least one carrier board, and at least one buckling set.

The carrier board is configured to carry the base board. The carrier board has a connecting section, a buckling section, a carrier section, and a carrier surface. The connecting section and the buckling section are respectively disposed at two ends of the carrier board, and the connecting section is connected to the fixing base. The carrier section connects the connecting section and the buckling section, and an airflow channel is formed in the carrier section. The carrier surface includes a surface of the carrier board which faces upward, and the carrier surface is configured to carry the base board. Multiple airflow outlets are formed on the carrier surface, the airflow outlets fluidly communicate with the airflow channel.

The buckling set is mounted at the buckling section of the carrier board, and the buckling set has a buckling unit movably mounted at the buckling section. The buckling unit and the carrier board are configured to selectively fix the base board.

The buckling unit of the buckling set in the base board floating arm is configured to abut a top surface of the base board to prevent the base board from vibrating during the delivery and getting wrinkled by the surrounding airflows, thereby raising the production yield. Therefore, the base board floating arm is capable of carrying a thin base board or a base board made of soft materials, thereby facilitating diversities in materials for the production of base boards.

Other objectives, advantages and novel features of the invention will become more apparent from the following detailed description when taken in conjunction with the accompanying drawings.

DETAILED DESCRIPTION OF THE PREFERRED EMBODIMENTS

Figure 1:
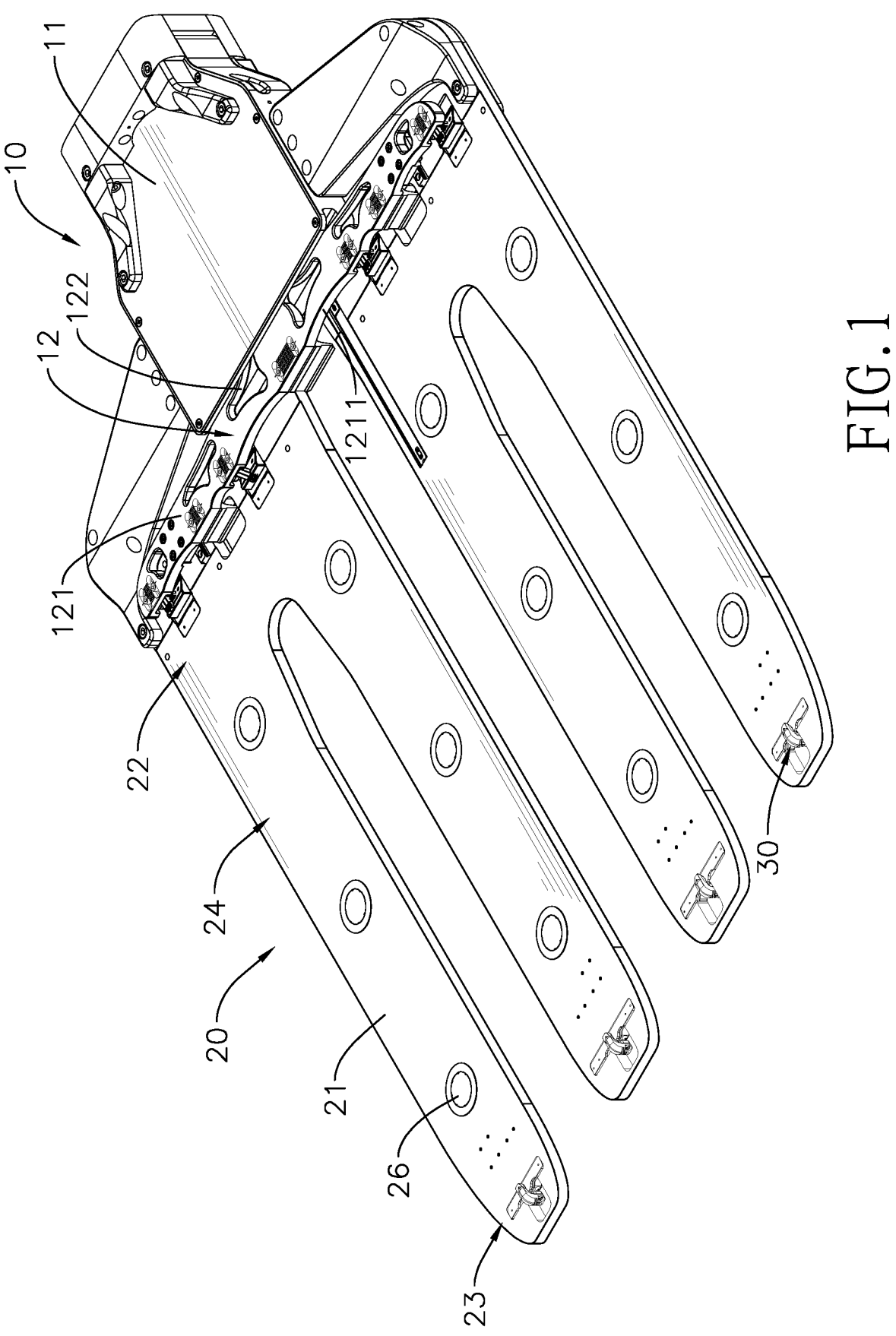
FIG. 1 is a perspective view of a base board floating arm in accordance with the present invention.
Figure 2:
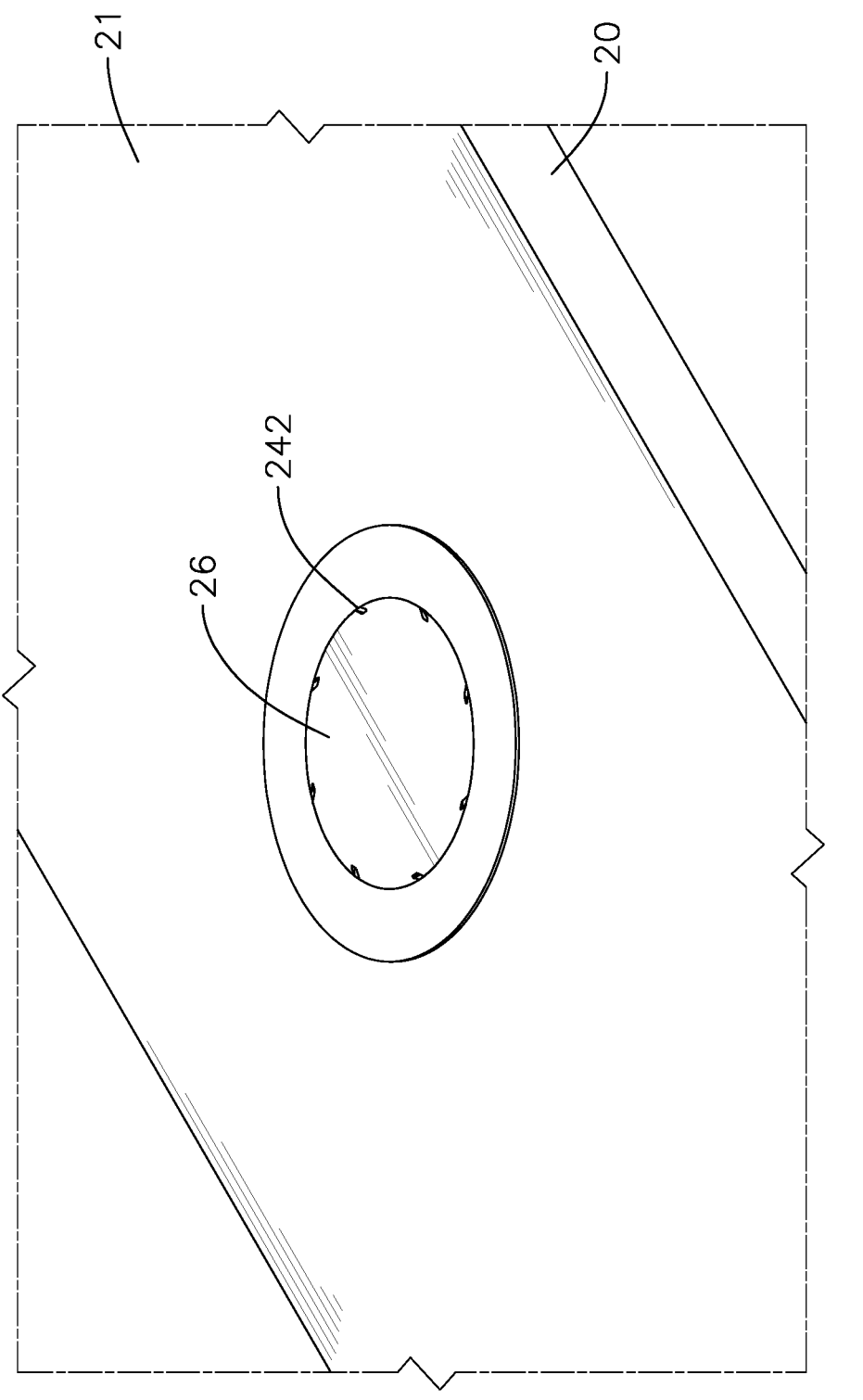
FIG. 2 is an enlarged view of the base board floating arm in FIG. 1, showing the airflow guiding unit mounted in the airflow slot.
Figure 3:
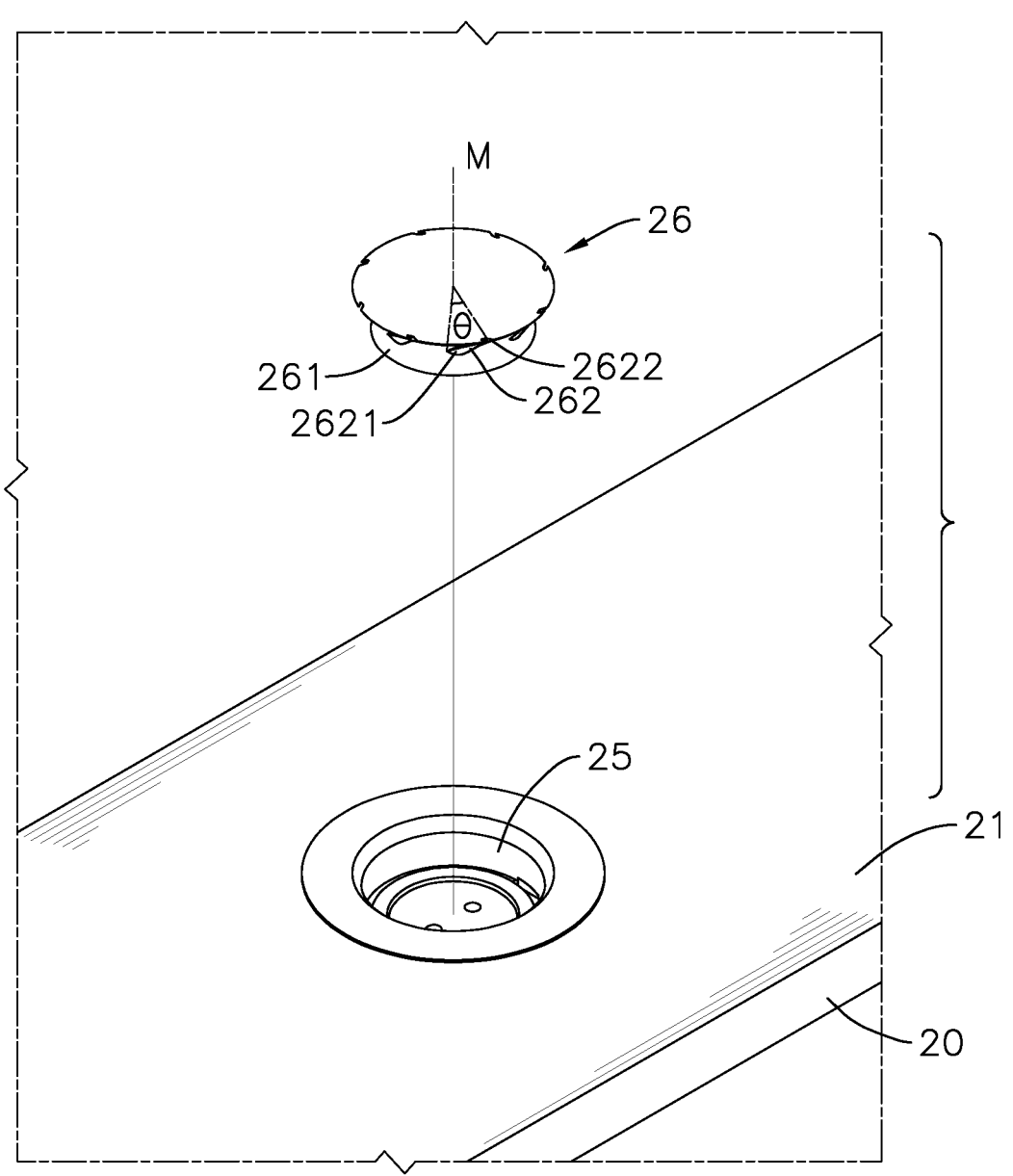
FIG. 3 is an exploded view of FIG. 2.

With reference to FIG. 1, a base board floating arm in accordance with the present invention is configured to carry a base board. The base board floating arm comprises a fixing assembly 10, at least one carrier board 20, and at least one buckling set 30. The base board floating arm in this embodiment includes four carrier boards 20 and four buckling sets 30; in another embodiment, the base board floating arm may have only two carrier boards 20 and two buckling sets 30, or may have more than four carrier boards 20 and more than four buckling sets 30. Besides, a quantity of the carrier board 20 may be different from a quantity of the buckling set 30.

The fixing assembly 10 includes a fixing base 11 and a pushing unit 12. The pushing unit 12 has a pushing portion 121 and a moving portion 122. The pushing portion 121 has a pushing surface 1211 facing away from the fixing base 11. The moving portion 122 is movably mounted in the fixing base 11. In this embodiment, the pushing portion 121 is connected to an end of the moving portion 122 which is oriented toward the carrier board 20, and pushes the base board along a direction away from the fixing base 11 via moving of the moving portion 122. In another embodiment, the pushing portion 121 may be connected to another position on the moving portion 122.

With reference to FIGS. 1 to 4, the carrier board 20 includes a carrier surface 21, a connecting section 22, a buckling section 23, a carrier section 24, multiple airflow slots 25, and multiple airflow guiding units 26. An upper surface of the carrier board 20 is the carrier surface 21, which is across the connecting section 22, the buckling section 23, and the carrier section 24. The carrier surface 21 is configured to carry the base board. To be more precise, the carrier board 20 is divided into the connecting section 22, the buckling section 23, and the carrier section 24, and surfaces of the connecting section 22, the buckling section 23, and the carrier section 24 which face upward are parts of the carrier surface 21.

The connecting section 22 and the buckling section 23 are disposed at two opposite ends of the carrier board 20. The connecting section 22 is connected to the fixing base 11, and the buckling set 30 is mounted at the buckling section 23. The four carrier boards 20 are separated into groups, each one of the groups including two of the carrier boards 20. The connecting sections 22 of the two carrier boards 20 in each one of the groups are connected to each other and thus form a shape like a fork. In another embodiment, the connecting sections 22 of the carrier boards 20 may not be connected to each other.

The carrier section 24 connects with the connecting section 22 and the buckling section 23, an airflow channel 241 is formed in the carrier section 24. The airflow slots 25 are recessed on a part of the carrier surface 21 in the carrier section 24 and fluidly communicate with the airflow channel 241. The airflow guiding units 26 are mounted in the airflow slot 25 respectively. Multiple airflow outlets 242 are formed between the carrier surface 21 and each one of the airflow guiding units 26 and fluidly communicate with the airflow channel 241.

Next please refer to FIGS. 3 to 6: each one of the airflow guiding units 26 has an annular wall surface 261 and multiple airflow guiding grooves 262. An airflow chamber 251 is formed between the annular wall surface 261 and an inner wall of the airflow slot 25, and the airflow chamber 251 fluidly communicates with the airflow channel 241. The airflow guiding groove 262 is recessed on the annular wall surface 261, and the airflow chamber 251 fluidly communicates with the airflow outlet 242 through the airflow guiding groove 262. The airflow guiding groove 262 includes an entering end 2621 and an exiting end 2622. The airflow outlet 242 is formed between the exiting end 2622 and the carrier surface 21. Wherein, a cross-sectional area of the entering end 2621 is larger than a cross-sectional area of the airflow outlet 242, but it is not limited thereto. Besides, a central axis M may be defined in each one of the airflow guiding units 26, and the annular wall surface 261 surrounds the central axis M. An extending direction of the airflow guiding groove 262 is inclined with respect to the central axis M. To be more precise, an angle is formed between an imaginary line connecting the entering end 2621 and the central axis M and another imaginary line connecting the exiting end 2622 and the central axis M, and the angle is larger than zero. In another embodiment, the extending direction of the airflow guiding groove 262 may not be inclined with respect to the central axis M.

With reference to FIGS. 7 to 10, the buckling sets 30 are disposed in the buckling sections 23 of the carrier boards 20 respectively. Each one of the buckling sets 30 includes a driving assembly 31, a guiding rod 32, a buckling unit 33, and a guiding unit 34. The driving assembly 31 is mounted in the buckling section 23 of the carrier board 20. The guiding rod 32 is movably and rotatably mounted at the driving assembly 31, and is capable of moving along a length direction of the guiding rod 32 via driving of the driving assembly 31.

The guiding rod 32 has a first end 321, a second end 322, an outer annular surface 323, and at least one track 324. The first end 321 is connected to the driving assembly 31, and the second end 322 is capable of moving between a buckling position and a releasing position with the guiding rod 32. A rotating axis of the guiding rod 32 may be defined as an axis extending along a length direction of the guiding rod 32, and the guiding rod 32 is capable of rotating about the rotating axis. The outer annular surface 323 surrounds the rotating axis. The at least one track 324 is formed on the outer annular surface 323 and inclined with respect to the rotating axis. To be more precise, each track 324 may include a spiral section and at least one straight section. The spiral section is inclined with respect to the rotating axis. The straight section extends along the length direction of the guiding rod 32. Therefore, the track 324 extends not only axially but also circumferentially along the guiding rod 32. In this embodiment, the track 324 includes two said straight sections and one said spiral section, and the straight sections are connected to two opposite ends of the spiral section, but it is not limited thereto.

The buckling unit 33 is connected to the second end 322 of the guiding rod 32 and capable of rotating with the guiding rod 32. The buckling unit 33 is configured to selectively fix the base board accompanied with the carrier board 20. The buckling section 23 may have a storage space, and the whole buckling unit 33 would be in the storage space of the buckling section 23 as long as the second end 322 is at the releasing position. To be more precise, as the second end 322 of the guiding rod 32 moves from the buckling position to the releasing position, the buckling unit 33 would rotate as well as the guiding rod 32 and then enters the storage space. Therefore, the buckling unit 33 would not protrude from the carrier surface 21. The buckling unit 33 has a buckling surface 331, when the second end 322 is at the buckling position, the buckling surface 331 is located above the carrier surface 21 and faces toward the carrier surface 21.

The guiding unit 34 is fixed at the buckling section 23 of the carrier board 20. The guiding unit 34 includes at least one guiding portion 341. The at least one guiding portion 341 abuts the at least one track 324 such that the at least one track 324 is capable of rotating during the driving assembly 31 driving the guiding rod 32 as well as the second end 322 moving between the buckling position and the releasing position.

In this embodiment, the guiding portion 341 is a protruding structure while the track 324 is recessed from the outer annular surface 323 of the guiding rod 32. When the guiding portion 341 abuts the track 324, the protruding guiding portion 341 would be partially in the recessed track 324. In another embodiment, the guiding portion may be recessed and the track may be protruding. In this embodiment, a quantity of the guiding portion 341 is two, and a quantity of the track 324 is two as well. The two said tracks 324 are located at two opposite sides of the outer annular surface 323 with respect to the rotating axis of the guiding rod 32, and the two guiding portions 341 abut the two tracks 324 respectively. In another embodiment, the guiding unit 34 may have only one guiding portion or more than two guiding portions, and the quantity of the track is equal to the quantity of the guiding portion.

Figure 7:
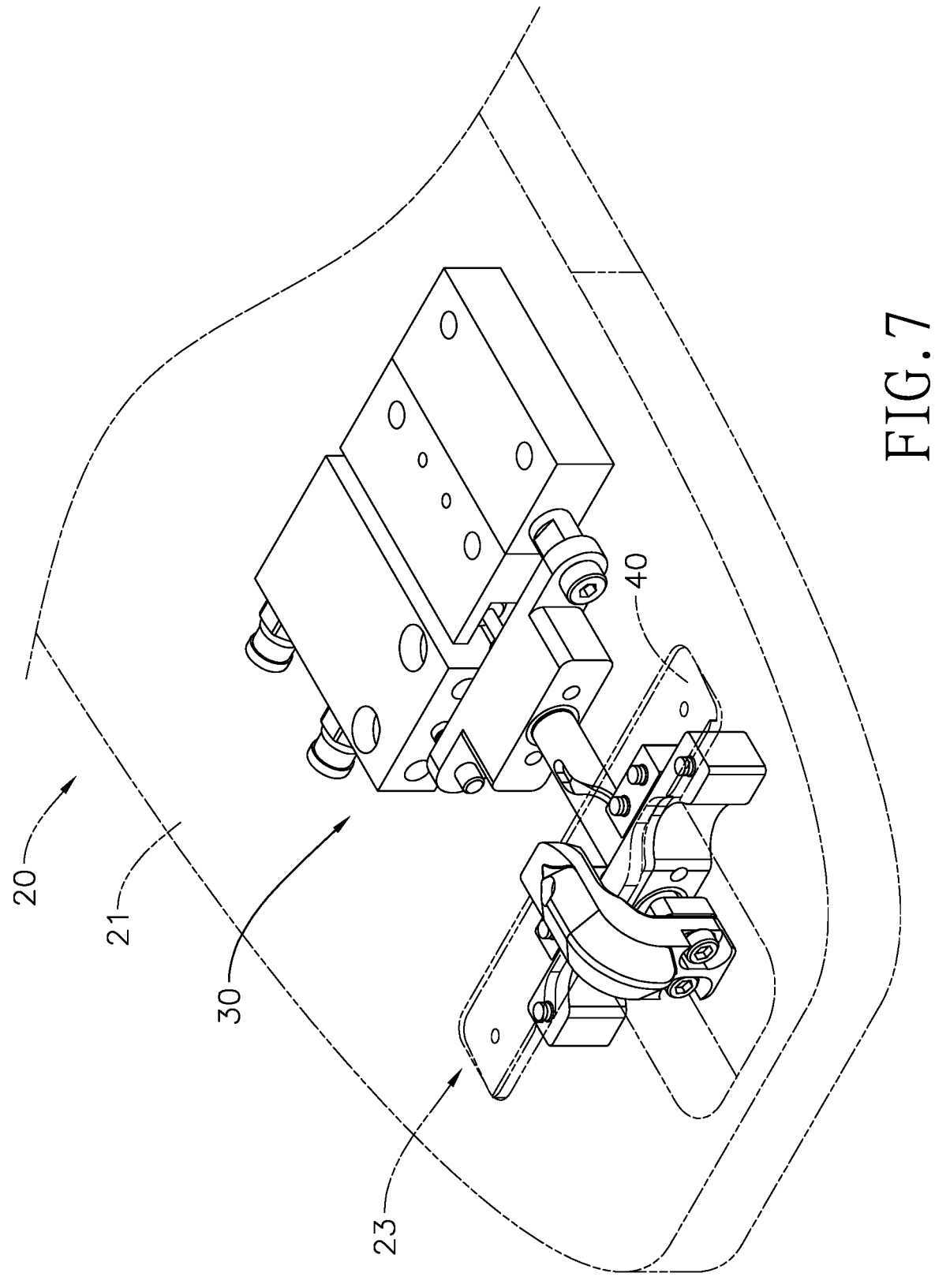
FIG. 7 is a partial perspective view of the base board floating arm in FIG. 1, showing the buckling set mounted on the carrier board.
Figure 8:
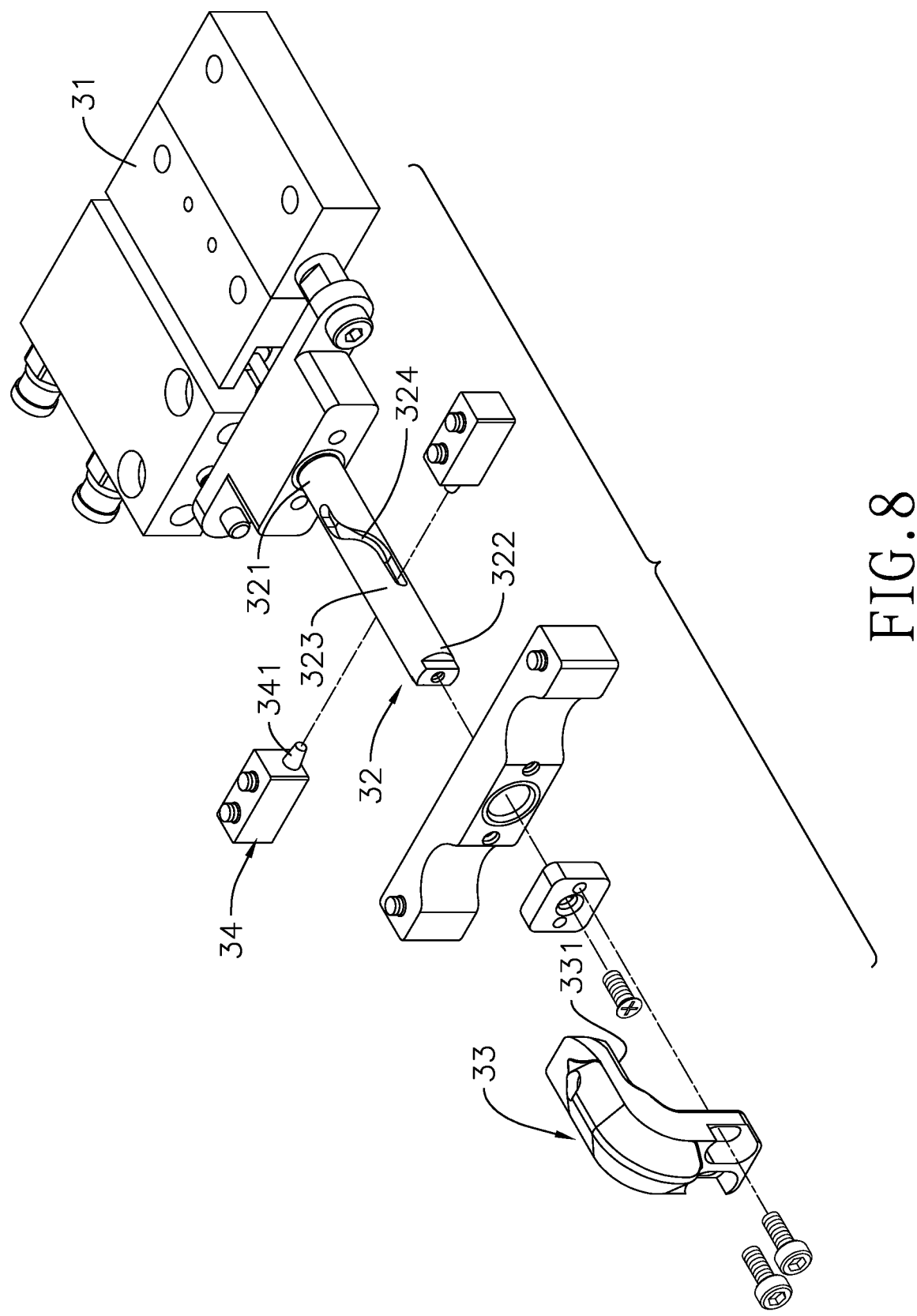
FIG. 8 is an exploded view of the buckling set of the base board floating arm in FIG. 1.
Figure 9:
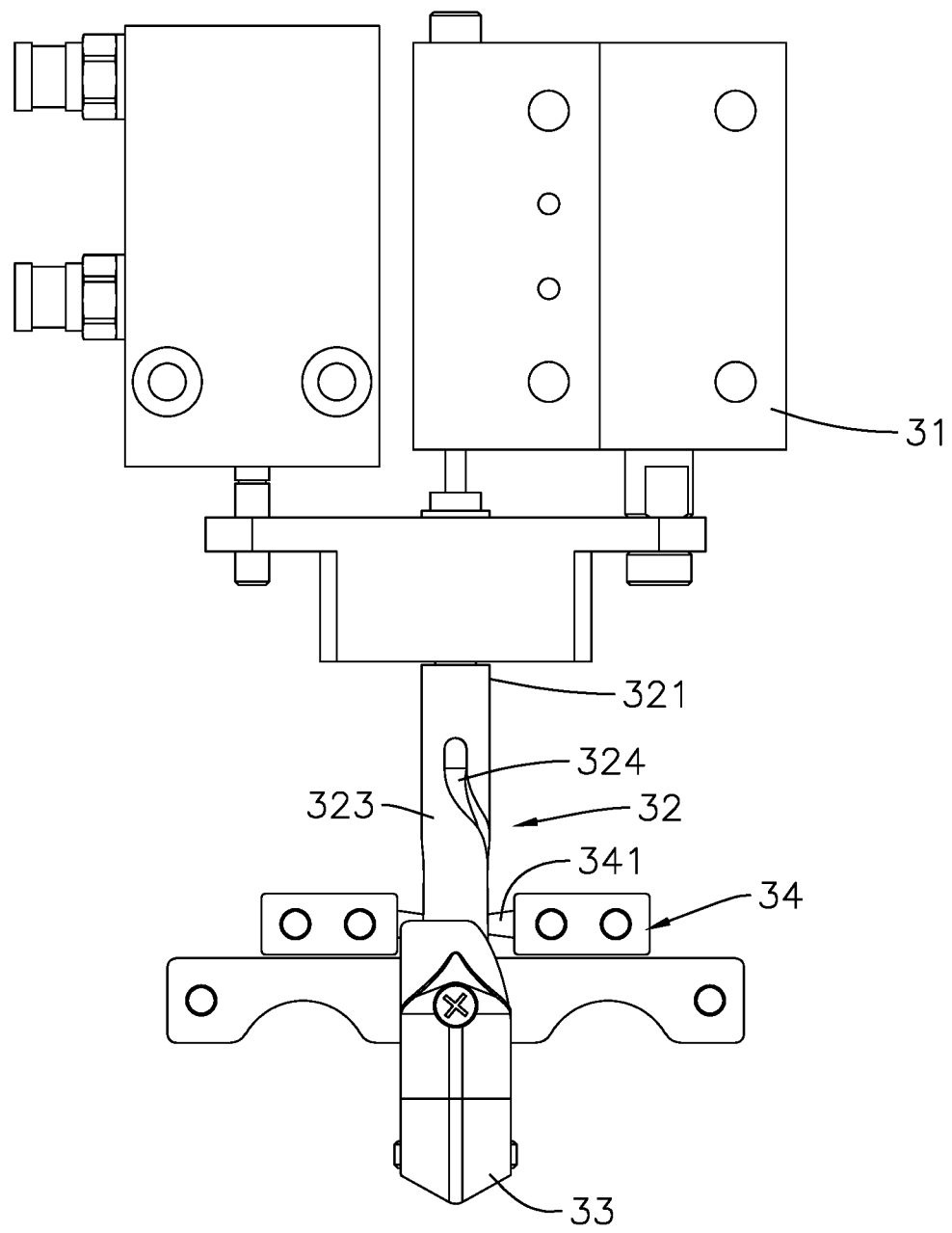
FIG. 9 is a top view of the buckling set of the base board floating arm in FIG. 1.
Figure 10:
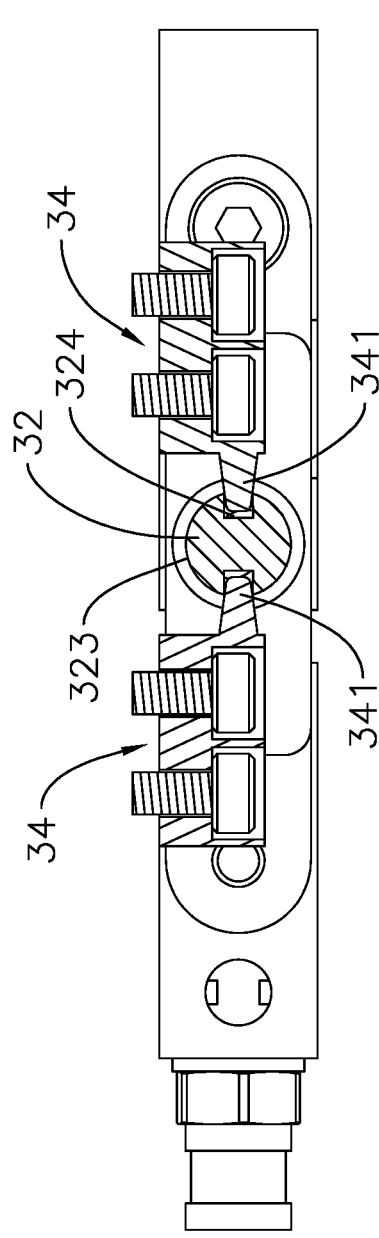
FIG. 10 is a cross-sectional view of the buckling set of the base board floating arm in FIG. 1, showing the guiding portions abutting the tracks.
Figure 10:

As shown in FIG. 7, the base board floating arm may further have a blocking unit 40 which is mounted on the carrier surface 21. The blocking unit 40 is configured to clamp the base board with the pushing unit 12; in another embodiment, the base board floating arm may not have the blocking unit 40.

Figure 11:
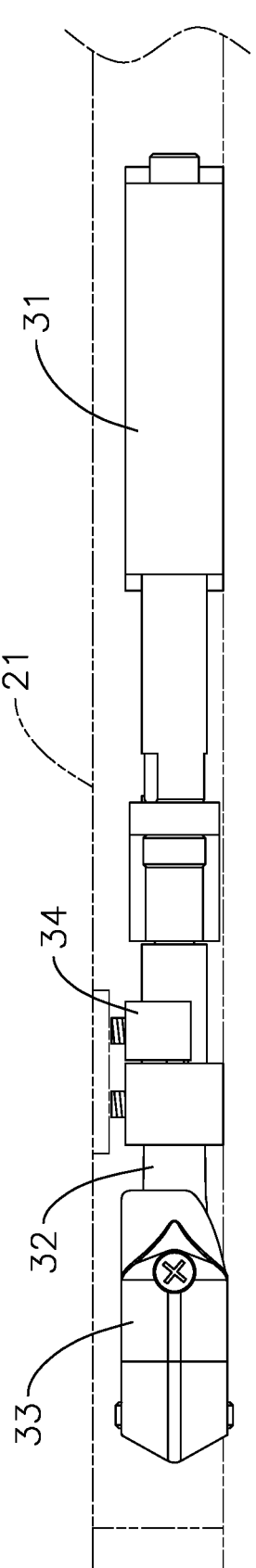
FIG. 11 is a side view of the buckling set of the base board floating arm in FIG. 1, shown with the second end at the releasing position.
Figure 12:
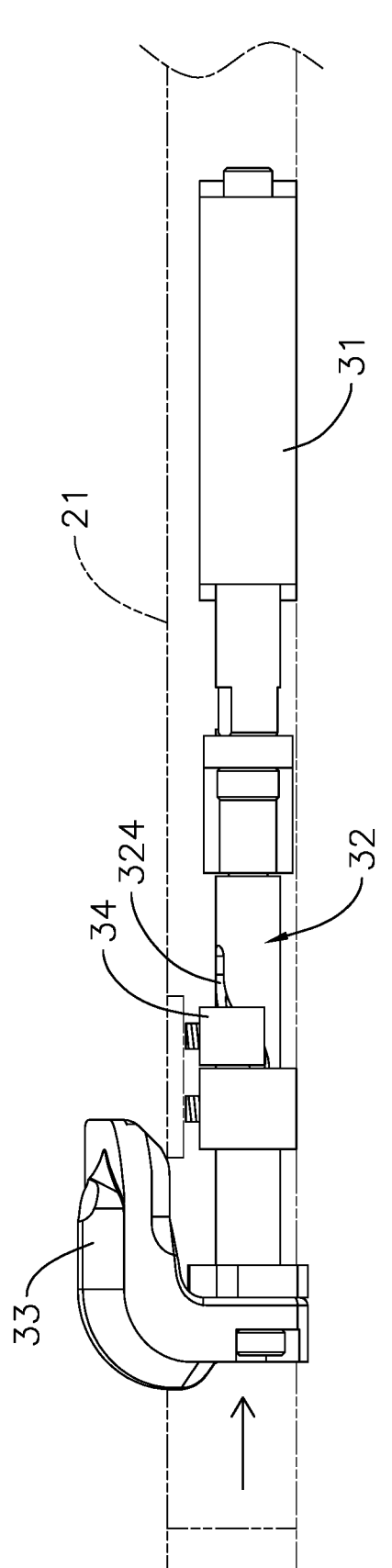
FIG. 12 is a side view of the buckling set of the base board floating arm in FIG. 1, shown with the second end between the releasing position and the buckling position.
Figure 13:
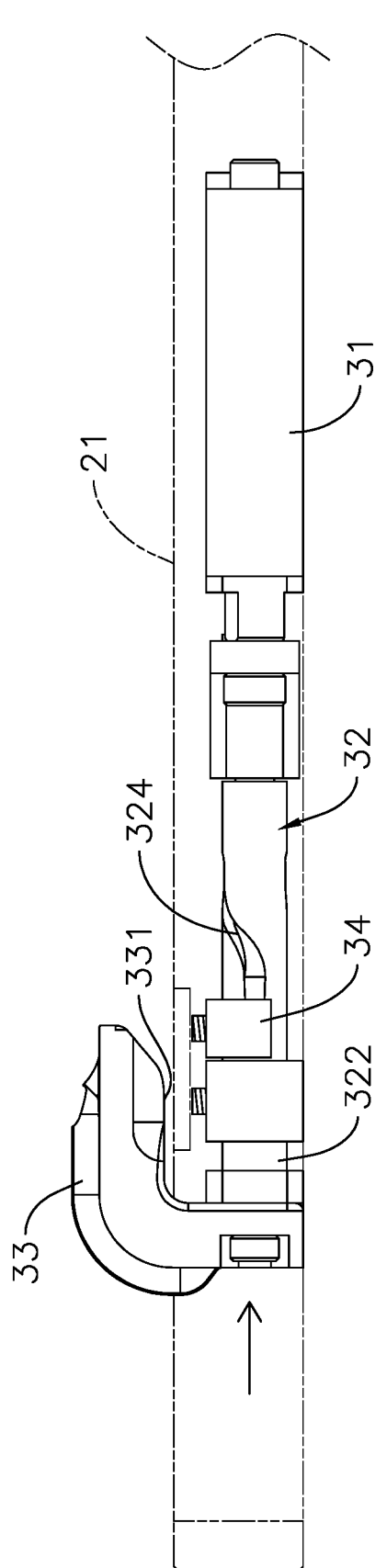
FIG. 13 is a side view of the buckling set of the base board floating arm in FIG. 1, shown with the second end at the buckling position.

Next please refer to FIGS. 11 to 13: as shown in FIG. 11, the second end 322 of the guiding rod 32 is at the releasing position, and the buckling unit 33 does not protrude from the carrier surface 21. Then as shown in FIG. 12, the driving assembly 31 drives the guiding rod 32 to move along the length direction of the guiding rod 32. When the second end 322 moves from the releasing position to the buckling position, since the guiding portions 341 of the guiding unit 34 abut the tracks 324 of the guiding rod 32, the guiding rod 32 rotates during the movement, and thereby the buckling unit 33 gradually protrudes from the carrier surface 21 with the rotation of the guiding rod 32.

As shown in FIG. 13, when the second end 322 of the guiding rod 32 is at the buckling position, the buckling unit 33 moves and rotates such that the buckling surface 331 is above and faces to the carrier surface 21 to complete the buckling.

To be more precise, when the guiding units 34 abut the spiral sections of the tracks 324, the guiding rod 32 would move axially and circumferentially; when the guiding units 34 abut the straight sections of the tracks 324, the guiding rod 32 would only move axially. Since the two straight sections are connected to the opposite ends of the spiral section in each one of the tracks 324, when the second end 322 moves from the releasing position to the buckling position, the buckling unit 33 is capable of rotating until the buckling surface 331 is above the carrier surface 21 and then moves to abut the base board, thereby preventing the buckling unit 33 from hitting the base board during the rotation.

Figure 4:
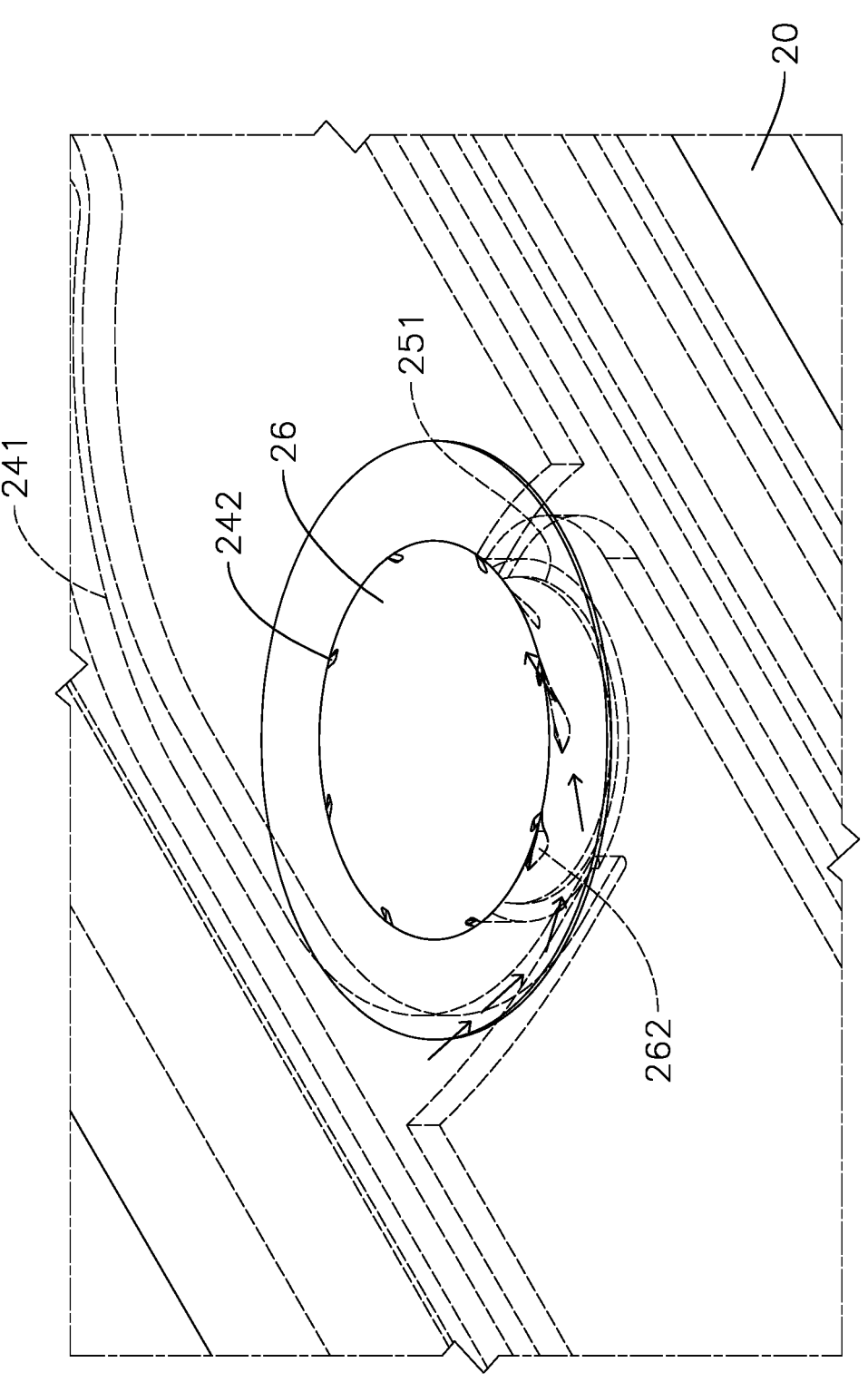
FIG. 4 is an enlarged view of FIG. 2, shown with the carrier board transparent.
Figure 5:
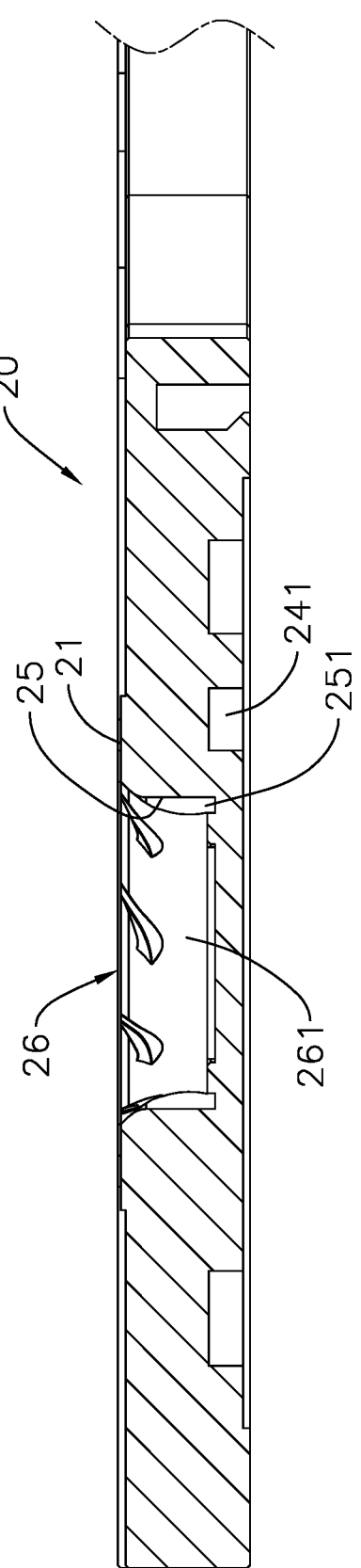
FIG. 5 is a cross-sectional view of the base board floating arm in FIG. 1, showing the airflow guiding unit mounted in the airflow slot.
Figure 6:
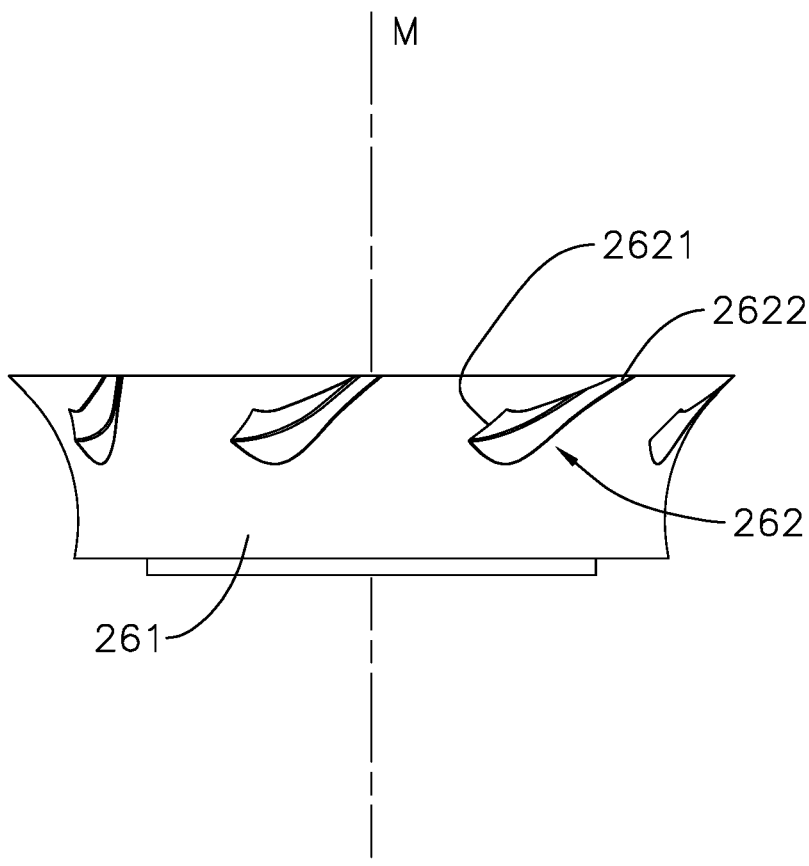
FIG. 6 is a side view of the airflow guiding unit of the base board floating arm in FIG. 1.
Figure 14:
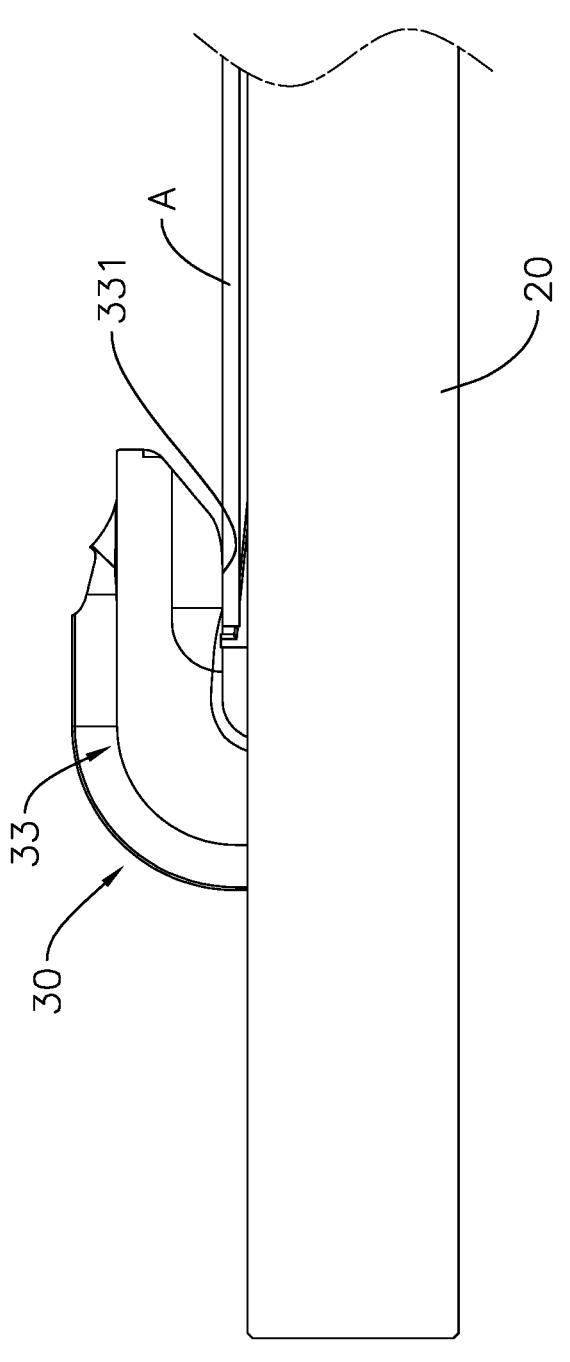
FIG. 14 is a partial side view of the base board floating arm in FIG. 1, shown with the buckling unit abutting the base board.
Figure 15:
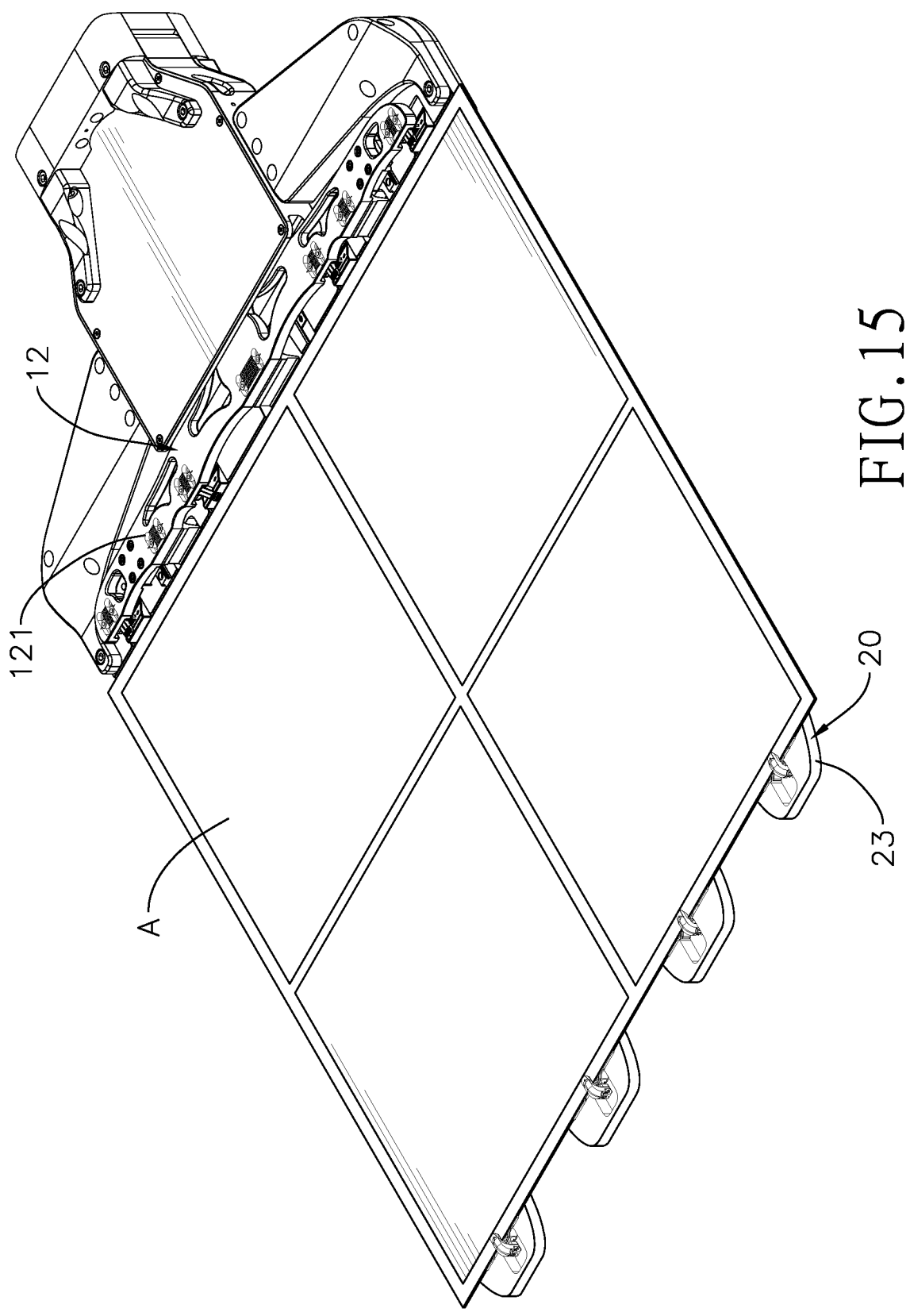
FIG. 15 is a perspective view of the base board floating arm in FIG. 1, shown with the base board floating board carrying the base board.

With reference to FIGS. 4 and 14 to 15, when the base board floating arm carries a base board A, the base board A is located on the carrier board 20. An airflow flows through the airflow chamber 251 and the airflow guiding grooves from the airflow channel 241, and then flows out from the airflow outlet 242 to support the base board A. A gas pressure between the base board A and the carrier board 20 is reduced due to the airflow flowing, and thereby the base board A is fixed on the carrier board 20 via a gas pressure above the base board A. Besides, the aforementioned airflow guiding grooves 262, which are inclined with respect to the central axis of the airflow guiding unit 26, are capable of reducing energy loss of the airflow while the airflow flows out from the airflow outlets 242. Next, the pushing unit 12 pushes the base board A toward the buckling section 23 of the carrier board 20 via the pushing portion 121, and then the buckling unit 33 of the buckling set 30 abuts the base board A to prevent the base board A from vibrating and getting wrinkled during the delivery.

In summary, the base board floating arm has the buckling set 30 to abut the base board, such that the base board floating arm is capable of preventing unexpected displacement of the base board which is caused by environmental airflows or vibrations, and further avoiding damages such as creases or protrusions to raise the production yield rate.

Even though numerous characteristics and advantages of the present invention have been set forth in the foregoing description, together with details of the structure and features of the invention, the disclosure is illustrative only.

Changes may be made in the details, especially in matters of shape, size, and arrangement of parts within the principles of the invention to the full extent indicated by the broad general meaning of the terms in which the appended claims are expressed.

What is claimed is:

1. A base board floating arm configured to carry a base board and comprising:
   a fixing base;
   at least one carrier board configured to carry the base board; each one of the at least one carrier board having:
      a connecting section and a buckling section respectively disposed at two ends of the carrier board; the connecting section connected to the fixing base;
      a carrier section connecting the connecting section and the buckling section, and an airflow channel formed in the carrier section;
      a carrier surface including a surface of the carrier board which faces upward, and the carrier surface configured to carry the base board; multiple airflow outlets formed on the carrier surface, the airflow outlets fluidly communicating with the airflow channel;
   at least one buckling set mounted at the buckling section of the carrier board, each one of the at least one buckling set having:
      a buckling unit movably mounted at the buckling section, and the buckling unit and the carrier board configured to selectively fix the base board.

2. The base board floating arm as claimed in claim 1, wherein the base board floating arm has a fixing assembly, and the fixing assembly includes the fixing base; the fixing assembly further comprises:
   a pushing unit including:
      a pushing portion having a pushing surface, and the pushing surface facing away from the fixing base; and
      a moving portion movably mounted in the fixing base.

3. The base board floating arm as claimed in claim 1, wherein the buckling set further comprises:
   a driving assembly mounted at the buckling section of the carrier board; and
   a guiding rod rotatably and movably mounted on the driving assembly, and the guiding rod being moveable along a length direction of the guiding rod via the driving assembly; the guiding rod including:
      a first end connected to the driving assembly; and
      a second end being moveable with the guiding rod between a buckling position and a releasing position of the guiding rod;
   wherein, the buckling unit is connected to the second end, and the buckling unit is rotatable with the guiding rod; the buckling unit has a buckling surface, when the second end is located at the buckling position, the buckling surface is above the carrier surface, and the buckling surface faces to the carrier surface.

4. The base board floating arm as claimed in claim 2, wherein the buckling set further comprises:
   a driving assembly mounted at the buckling section of the carrier board; and
   a guiding rod rotatably and movably mounted on the driving assembly, and the guiding rod being moveable along a length direction of the guiding rod via the driving assembly; the guiding rod including:
      a first end connected to the driving assembly; and
      a second end being moveable with the guiding rod between a buckling position and a releasing position of the guiding rod;

wherein, the buckling unit is connected to the second end, and the buckling unit is rotatable with the guiding rod; the buckling unit has a buckling surface, when the second end is located at the buckling position, the buckling surface is above the carrier surface, and the buckling surface faces to the carrier surface.

5. The base board floating arm as claimed in claim 3, wherein:

the guiding rod has a rotating axis extending along the length direction of the guiding rod, and the guiding rod is rotatable about the rotating axis; the guiding rod further comprises:
an outer annular surface around the rotating axis; and
at least one track formed on the outer annular surface, and the at least one track inclined with respect to the rotating axis; and the at least one buckling set further comprises:
a guiding unit mounted at the buckling section of the carrier board, and the guiding unit including at least one guiding portion; the at least one guiding portion abutting the at least one track;

thereby, when the driving assembly drives the guiding rod to move the second end between the buckling position and the releasing position, the at least one track is abutted by the at least one guiding portion, and thus the guiding rod is capable of rotating.

6. The base board floating arm as claimed in claim 4, wherein:

the guiding rod has a rotating axis extending along the length direction of the guiding rod, and the guiding rod is rotatable about the rotating axis; the guiding rod further comprises:
an outer annular surface around the rotating axis; and
at least one track formed on the outer annular surface, and the at least one track inclined with respect to the rotating axis; and the at least one buckling set further comprises:
a guiding unit mounted at the buckling section of the carrier board, and the guiding unit including at least one guiding portion; the at least one guiding portion abutting the at least one track;

thereby, when the driving assembly drives the guiding rod to move the second end between the buckling position and the releasing position, the at least one track is abutted by the at least one guiding portion, and thus the guiding rod is capable of rotating.

7. The base board floating arm as claimed in claim 5, wherein the at least one guiding portion includes two said guiding portions, and the at least one track includes two said tracks; the two tracks are disposed at two sides of the outer annular surface with respect to the rotating axis; the two guiding portions abut the two tracks respectively.

8. The base board floating arm as claimed in claim 6, wherein the at least one guiding portion includes two said guiding portions, and the at least one track includes two said tracks; the two tracks are disposed at two sides of the outer annular surface with respect to the rotating axis; the two guiding portions abut the two tracks respectively.

9. The base board floating arm as claimed in claim 1, wherein each one of the at least one carrier board further includes:

multiple airflow slots formed on the carrier surface, and the airflow slots fluidly communicating with the airflow channel; and multiple airflow guiding units mounted in the airflow slots respectively, and each one of the airflow guiding units having an annular wall surface; an airflow chamber formed between the annular wall surface and an inner wall surface of the airflow slot, and the airflow chamber fluidly communicating with the airflow channel;

wherein, the airflow outlets are formed between the carrier surface and each one of the airflow guiding units, and the airflow outlets fluidly communicate with the airflow chamber.

10. The base board floating arm as claimed in claim 8, wherein each one of the at least one carrier board further includes:

multiple airflow slots formed on the carrier surface, and the airflow slots fluidly communicating with the airflow channel; and multiple airflow guiding units mounted in the airflow slots respectively, and each one of the airflow guiding units having an annular wall surface; an airflow chamber formed between the annular wall surface and an inner wall surface of the airflow slot, and the airflow chamber fluidly communicating with the airflow channel;

wherein, the airflow outlets are formed between the carrier surface and each one of the airflow guiding units, and the airflow outlets fluidly communicate with the airflow chamber.

11. The base board floating arm as claimed in claim 9, wherein each one of the airflow guiding units has:

multiple airflow guiding grooves formed on the annular wall surface, and the airflow chamber fluidly communicating with the airflow outlets via the airflow guiding grooves.

12. The base board floating arm as claimed in claim 10, wherein each one of the airflow guiding units has:

multiple airflow guiding grooves formed on the annular wall surface, and the airflow chamber fluidly communicating with the airflow outlets via the airflow guiding grooves.

13. The base board floating arm as claimed in claim 11, wherein each one of the airflow guiding units has a central axis, and the annular wall surface surrounds the central axis, an extending direction of each one of the airflow guiding grooves is inclined with respect to the central axis thereof.

14. The base board floating arm as claimed in claim 12, wherein each one of the airflow guiding units has a central axis, and the annular wall surface surrounds the central axis, an extending direction of each one of the airflow guiding grooves is inclined with respect to the central axis thereof.

15. The base board floating arm as claimed in claim 11, wherein each one of the airflow guiding grooves further has:

an entering end and an exiting end, the airflow outlet formed between the exiting end and the carrier surface, and a cross-sectional area of the entering end being larger than a cross-sectional area of the airflow outlet.

16. The base board floating arm as claimed in claim 14, wherein each one of the airflow guiding grooves further has:

an entering end and an exiting end, the airflow outlet formed between the exiting end and the carrier surface, and a cross-sectional area of the entering end being larger than a cross-sectional area of the airflow outlet.

17. The base board floating arm as claimed in claim 1, wherein a quantity of the at least one carrier board is four, and the four carrier boards are separated into groups, each one of the groups includes two of the carrier boards; the connecting sections of the two carrier boards in each one of the groups are connected to each other.

18. The base board floating arm as claimed in claim 16, wherein a quantity of the at least one carrier board is four, and the four carrier boards are separated into groups, each one of the groups includes two of the carrier boards; the connecting sections of the two carrier boards in each one of the groups are connected to each other.

\* \* \* \* \*